(12) United States Patent
Kim et al.

(10) Patent No.: US 7,358,528 B2
(45) Date of Patent: Apr. 15, 2008

(54) LIQUID CRYSTAL DISPLAY DEVICE AND FABRICATION METHOD THEREOF

(75) Inventors: Sung Ki Kim, Seoul (KR); Yong Jin Cho, Seoul (KR); Hae Yeol Kim, Gyeonggi-do (KR); Juhn Suk Yoo, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 183 days.

(21) Appl. No.: 11/316,967

(22) Filed: Dec. 27, 2005

(65) Prior Publication Data
US 2006/0141685 A1 Jun. 29, 2006

(30) Foreign Application Priority Data
Dec. 28, 2004 (KR) .................. 10-2004-0114394

(51) Int. Cl.
*H01L 29/04* (2006.01)
(52) U.S. Cl. .................. 257/57; 257/59; 257/66; 257/72; 257/E29.151
(58) Field of Classification Search .................. 257/72, 257/57, 59, 61, 66
See application file for complete search history.

(56) References Cited

U.S. PATENT DOCUMENTS

| | | | |
|---|---|---|---|
| 5,478,766 A * | 12/1995 | Park et al. | 438/158 |
| 5,677,549 A * | 10/1997 | Takayama et al. | 257/66 |
| 6,323,068 B1 * | 11/2001 | Seo | 438/154 |
| 2003/0124755 A1 * | 7/2003 | Yamanaka et al. | 438/30 |
| 2004/0105067 A1 * | 6/2004 | Kim et al. | 349/187 |

FOREIGN PATENT DOCUMENTS

WO WO 0178045 10/2001

OTHER PUBLICATIONS

Korea Office action dated Apr. 24, 2006 for Korea Application No. 10-2004-0114394.

* cited by examiner

*Primary Examiner*—Michael Trinh
(74) *Attorney, Agent, or Firm*—Seyfarth Shaw, LLP

(57) ABSTRACT

A method for fabricating a liquid crystal display includes providing a first substrate having a pixel part and a driving circuit part, forming a gate electrode in the pixel part of the first substrate, forming a first insulation film, a first amorphous silicon thin film and a second amorphous silicon thin film on the first substrate, forming a first conductive film on the first substrate, having the first insulation film, the first amorphous silicon thin film, and the second amorphous silicon thin film, selectively patterning the first conductive film, the second amorphous silicon thin film and the first amorphous silicon thin film to form an active pattern in each of the pixel part and the driving circuit part of the first substrate and source and drain electrodes, crystallizing the first amorphous silicon thin film constituting the active pattern of the driving circuit part, forming a second insulation film on the first substrate, forming a pixel electrode in the pixel part and a gate electrode in the driving circuit part, and attaching the first substrate to a second substrate.

16 Claims, 8 Drawing Sheets

LIQUID CRYSTAL DISPLAY DEVICE AND FABRICATION METHOD THEREOF

The present invention claims the benefit of Korean Patent Application No. 114394/2004 filed in Korea on Dec. 28, 2004, which is hereby incorporated by reference in its entirety.

BACKGROUND OF THE INVENTION

1. Field of the Invention

The present invention relates to a display device and, more particularly, to a liquid crystal display (LCD) device and a fabrication method thereof. Although the present invention is suitable for a wide scope of applications, it is particularly suitable for a driving circuit-integrated LCD device in which an amorphous silicon thin film transistor and a polycrystalline silicon thin film transistor are simultaneously formed within a single panel.

2. Description of the Related Art

In the information society, importance of a display device for use a visual information transfer medium is increasing. In order for a display device to have value in the market, the display device should have the characteristics of low power consumption, a thin profile, light weight and high picture quality. A liquid crystal display (LCD) is a flat panel display that has these characteristics as well as being suitable for mass production, so various types of brand-new products of LCDs have been introduced into the market. LCDs are now seen as a replacement for the existing cathode ray tubes (CRTs).

In general, the LCD device displays a desired image by controlling light transmittance of liquid crystal cells by separately supplying a data signal according to image information to the liquid crystal cells arranged in a matrix form. The LCD device includes a color filter substrate, or a first substrate, an array substrate, or a second substrate, and a liquid crystal layer formed between the color filter substrate and the array substrate. On the array substrate, a thin film transistor (TFT) is commonly used as a switching device, and an amorphous silicon thin film or a polycrystalline silicon thin film may be used as a channel layer of the TFT.

In fabricating the LCD device, a plurality of masking processes (namely, a photolithography process) are required to fabricate the LCD device, including the TFT. Reducing the number of masking processes increases productivity. Further, reducing the number of masking processes decreases the probabilities in mask alignment error. The structure of a related art LCD device will now be described with reference to FIG. 1.

FIG. 1 is a perspective view of a related art LCD device. As shown in FIG. 1, the related art LCD device includes a color filter substrate 5, an array substrate 10 and a liquid crystal layer 40 formed between the color filter substrate 5 and the array substrate 10. The color filter substrate 5 includes a color filter (C) having red (R), green (G) and blue (B) sub-color filters 7, a black matrix 6 separating the sub-color filters (C) for blocking light transmitted through the liquid crystal layer 40, and a transparent common electrode 8 for applying a voltage to the liquid crystal layer 40. On the array substrate 10, gate lines 16 are arranged horizontally and data lines 17 are arranged vertically to define pixel regions (P). A thin film transistor (TFT), a switching device, is formed adjacent to the crossing of one of the gate lines 16 and one of the data lines 17, and a pixel electrode 18 is formed in each pixel region (P). The pixel region (P) is a sub-pixel corresponding to a single sub-color filter 7, and a color image is obtained by combining the three types of red, green and blue colors. The red, green and blue sub-pixels make one pixel, and the TFT (T) is connected to the red, green and blue sub-pixels.

Although not shown in FIG. 1, the TFT (T) includes a gate electrode connected to the gate line 16, a source electrode connected to the data line 17, and a drain electrode connected to the pixel electrode 18. In addition, the TFT (T) includes an insulation film for insulating the gate electrode from the source electrode, drain electrode and a channel layer. The channel layer forms a conductive channel between the source and drain electrodes in response to a signal on the gate electrode.

The channel layer is formed of an amorphous silicon thin film or a polycrystalline silicon thin film. A polycrystalline silicon TFT using polycrystalline silicon thin film has a different structure from that of the amorphous silicon TFT. Thus, the polycrystalline silicon TFT and the amorphous silicon TFT are formed separately through different fabrication process when both a polycrystalline silicon TFT and an amorphous silicon TFT are formed on the same substrate.

Depending on where the source, drain and gate electrodes are positioned with respect to each other, a TFT can have either a staggered structure or a coplanar structure. FIGS. 2A and 2B are cross-sectional views of a related art amorphous silicon TFT with the staggered structure and a related art polycrystalline silicon TFT with the coplanar structure, respectively. With reference to FIG. 2A, the staggered structure is formed such that a gate electrode 21' is formed on a lower layer and source and drain electrodes 22' and 23' are formed on an upper layers with an insulation film 15 interposed therebetween. The staggered structure is typically used for amorphous silicon TFTs. As shown in FIG. 2B, the coplanar structure is formed such that a gate electrode 21" is formed on the gate insulating film 15A and source and drain electrodes 22" and 23" are formed through the gate insulating film 15A and on the passivation layer 15B. The coplanar is typically used for a CMOS (Complementary Metal Oxide Semiconductor) polycrystalline silicon TFT. The amorphous silicon TFT with the staggered structure is formed directly on the substrate 10 as shown in FIG. 2A. The polycrystalline silicon TFT with the coplanar structure is formed on a buffer layer 11 on the array substrate, as shown in FIG. 2B. layer.

In the case of the amorphous silicon TFT with the staggered structure, the gate insulation film 15, an active pattern 24' and an ohmic-contact layer 25 are formed through successive deposition, so that interface states are minimized. In the case of forming channel etch (BCE) as shown in FIG. 2A, an over-etching margin of the silicon thin film should be provided. Thus, a deposited amorphous silicon thin film needs to have the thickness of about 170 nm.

In the case of the polycrystalline silicon TFT with the coplanar structure shown in FIG. 2B, the amorphous silicon thin film is crystallized to form an active pattern 24" and then a gate electrode 21" is formed. This results in degradation of the interface characteristics as compared with the amorphous silicon TFT. The thickness of the silicon thin film required for enhancing crystallization efficiency is about 50 nm, which is relatively thin compared to the amorphous silicon TFT.

The two TFT structures are independent structures, so it is difficult to implement both structures within a single panel due to the problems of designing, masking and a fabrication process with the current level of technologies. To fabricate a driving circuit-integrated LCD device in which both a driving circuit part and a pixel part are installed on the glass substrate, the polycrystalline silicon TFT, which is suitable for a high speed operation of 1 MHz or higher and has relatively large mobility should be used in the driving circuit part. Thus, in the related art driving circuit-integrated LCD device, a pixel driving TFT for driving each pixel of the pixel part and a driving circuit TFT for operating the pixel driving TFT and applying signals to the gate line and the data line are fabricated with amorphous silicon. In this case, the TFT of the driving circuit part requires an additional thermal process to form the polycrystalline silicon thin film and is fabricated by using a different fabrication process from that of the amorphous silicon TFT for the pixel part.

The polycrystalline silicon thin film is formed by thermally processing the amorphous silicon thin film after the amorphous silicon thin film is formed. High-priced equipment, such as laser, is required for the thermal processing of the amorphous silicon thin film into a polycrystalline silicon thin film. Such thermal processing can take a long time. In addition, since the polycrystalline silicon TFT has the coplanar structure, different from the stagger structure of the amorphous silicon TFT, the existing fabrication line used for the amorphous silicon TFT cannot be used for a polycrystalline silicon TFT.

SUMMARY OF THE INVENTION

Accordingly, the present invention is directed to a liquid crystal display (LCD) device and a fabrication method thereof that substantially obviate one or more of the problems due to limitations and disadvantages of the related art.

An object of the present invention is to provide a liquid crystal display (LCD) device and its fabrication method thereof in which an amorphous silicon thin film transistor (TFT) and a polycrystalline silicon TFT are simultaneously formed on a single panel.

Another object of the present invention is to provide a liquid crystal display (LCD) device having a driver driving circuit on the panel of an LCD device.

Another object of the present invention is to simplify a fabrication of a liquid crystal display (LCD) device by simultaneously forming a pixel amorphous silicon TFT and a driving circuit polycrystalline silicon TFT.

To achieve these and other advantages and in accordance with the purpose of the present invention, as embodied and broadly described herein, there is provided a method for fabricating a liquid crystal display includes providing a first substrate having a pixel part and a driving circuit part, forming a gate electrode in the pixel part of the first substrate, forming a first insulation film, a first amorphous silicon thin film and a second amorphous silicon thin film on the first substrate, forming a first conductive film on the first substrate, having the first insulation film, the first amorphous silicon thin film, and the second amorphous silicon thin film, selectively patterning the first conductive film, the second amorphous silicon thin film and the first amorphous silicon thin film to form an active pattern in each of the pixel part and the driving circuit part of the first substrate and source and drain electrodes, crystallizing the first amorphous silicon thin film constituting the active pattern of the driving circuit part, forming a second insulation film on the first substrate, forming a pixel electrode in the pixel part and a gate electrode in the driving circuit part, and attaching the first substrate to a second substrate.

In another aspect, a method for fabricating a liquid crystal display device includes providing a first substrate divided into a pixel part, including first and second regions, and a driving circuit part, forming a gate electrode in the first region of the pixel part, forming a first insulation film, an amorphous silicon thin film and an n+ amorphous silicon thin film on the first substrate, activating the second region of the pixel part and the n+ amorphous silicon thin film of the driving circuit part, forming a first conductive film on the first substrate and selectively patterning the first conductive film, the n+ amorphous silicon thin film and the amorphous silicon thin film to form active patterns in the pixel part and in the driving circuit part with source and drain electrodes at upper portions thereof, crystallizing the amorphous silicon thin films constituting the active pattern of the driving circuit part and the active pattern of the second region of the pixel part, forming a second insulation film on the first substrate, forming a pixel electrode at the first region of the pixel part, a first gate electrode at the second region of the pixel part and a second gate electrode at the driving circuit part of the first substrate, and attaching the first and second substrates.

In another aspect, a liquid crystal display device includes a first substrate divided into a pixel part and a driving circuit part, an amorphous silicon thin film transistor formed on the pixel part of the first substrate having a gate electrode, an active pattern, source and drain electrodes and a pixel electrode, a polycrystalline silicon thin film transistor formed in the driving circuit part of the first substrate and having an active pattern, source and drain electrodes and a gate electrode formed on the same layers respectively corresponding to the active pattern, the source and drain electrodes and the pixel electrode of the amorphous silicon thin film transistor, and a second substrate, a color filter substrate, attached to the first substrate in a facing manner.

In yet another aspect, a liquid crystal display device includes an amorphous silicon thin film transistor formed on a first region of a first substrate and comprised of a gate electrode, an active pattern, source and drain electrodes and a pixel electrode, a polycrystalline silicon thin film transistor formed on a second region of the first substrate and comprised of an active pattern, source and drain electrodes and a gate electrode formed on the same layer respectively corresponding to the active pattern, the source and drain electrodes and the pixel electrode of the first region, and a second substrate, a color filter substrate, attached to the first substrate in a facing manner.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

The liquid crystal display (LCD) device and its fabrication method in accordance with the present invention will now be described in detail with reference to the accompanying drawings.

Figure 1:
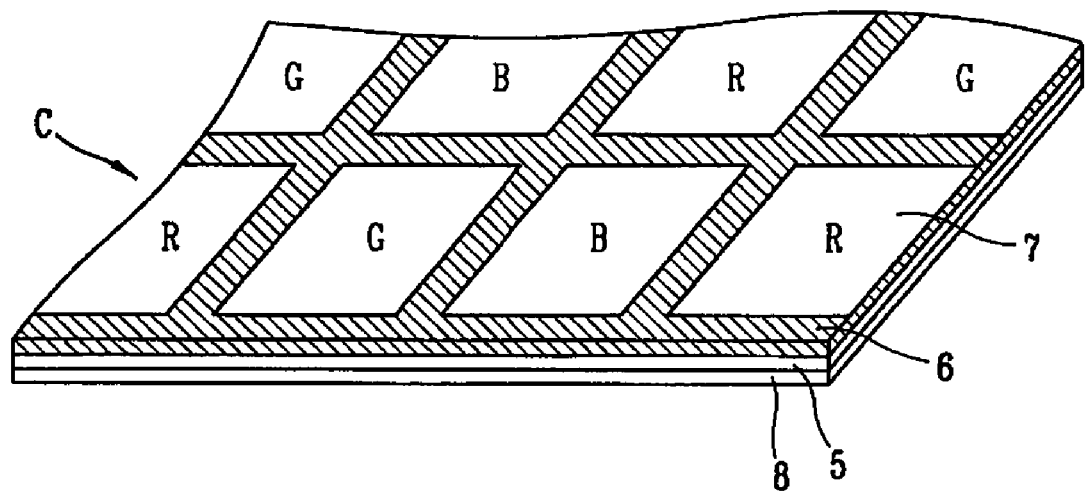
FIG. 1 is a perspective view of a related art liquid crystal display (LCD) device.
Figure 1:
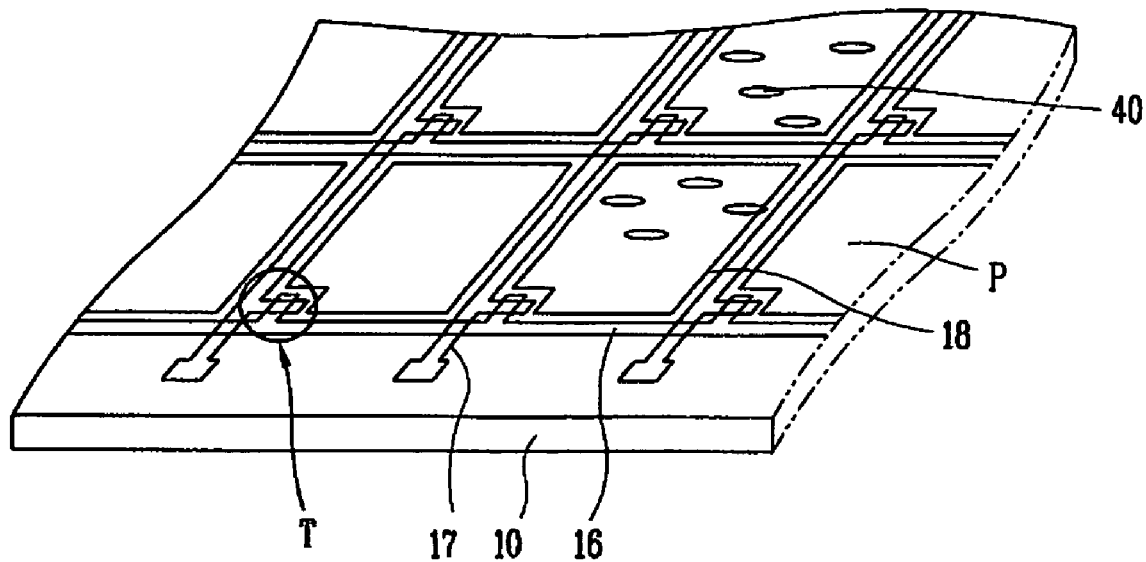
Figure 2A:
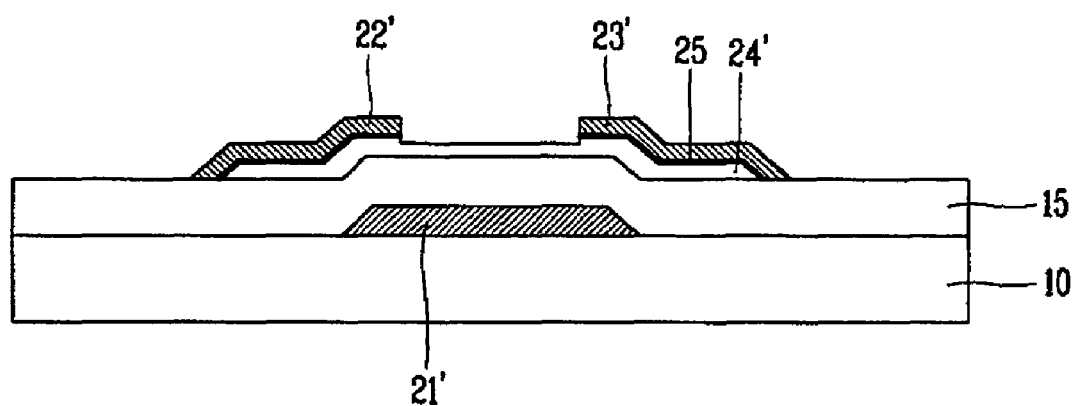
FIG. 2A is a cross-sectional view of a related art amorphous silicon thin film transistor (TFT) with a staggered structure.
Figure 2B:
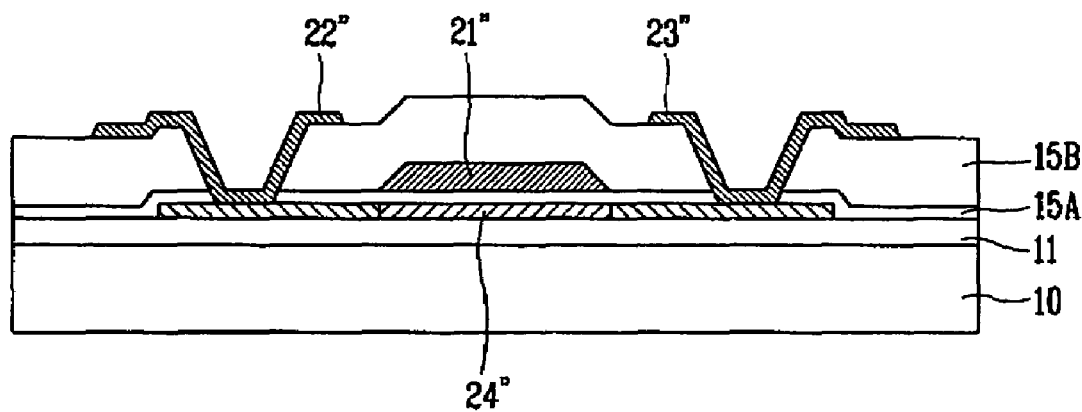
FIG. 2B is a cross-sectional view of a related art polycrystalline silicon thin film transistor (TFT) with a coplanar structure.
Figure 3:
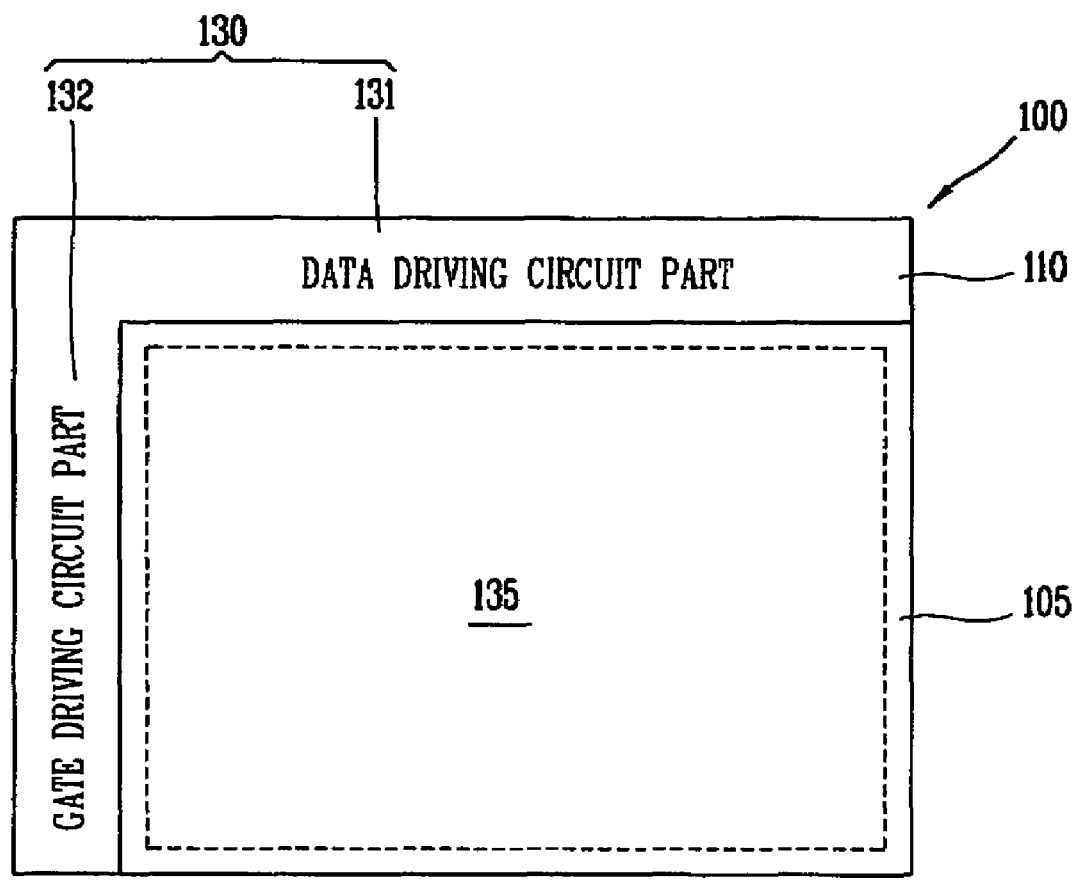
FIG. 3 is a plan view of a driving circuit-integrated LCD device in accordance with an embodiment of the present invention.

FIG. 3 is a plan view of an of a driving circuit-integrated LCD device in accordance with an embodiment of the present invention. As shown in FIG. 3, an LCD device 100 includes an array substrate 110, a color filer substrate 105, and a liquid crystal layer (not shown) formed between the array substrate 110 and the color filter substrate 105. The array substrate 110 includes a pixel part 135, an image display region in which unit pixels are arranged in a matrix form, and a driving circuit part 130 having a gate driving circuit part 132 positioned at an outer edge of the pixel part 135 and a data driving circuit part 131.

Although not shown in FIG. 3, the pixel part 135 of the array substrate 110 includes gate lines horizontally arranged and data lines vertically arranged to define a plurality of pixel regions on the substrate 110. In addition, a TFT, a switching device, is formed adjacent to each crossing of the gate lines and the data lines, and a pixel electrode connected to the TFT is formed in the pixel region. The TFT controls the application of a signal voltage to the pixel electrode using a field effect transistor (FET) to control the flow of current by a field effect.

The array substrate 110 is larger than the color substrate 105 and the driving circuit part 130 is positioned at an outer edge of the array substrate 110 outside of the color substrate 105. In this case, the data driving circuit part 131 is positioned at the longer side of the array substrate 110 outside of the color substrate 105 and the gate driving circuit part 132 is positioned at the shorter side of the array substrate 110 outside of the color substrate 105.

At this time, in order to suitably output an input signal, the data driving circuit part 131 and the gate driving circuit part 132 use a TFT in a CMOS (Complementary Metal Oxide Semiconductor) structure, as an inverter. For reference, a CMOS is a type of integrated circuit having a pair of N channel and P channel MOS TFTs used for the driving circuit part, which requires a high speed signal processing. The speed and density characteristics of a CMOS are between those of an NMOS transistor and a PMOS transistor.

The gate driving circuit part 132 and the data driving circuit part 131 respectively supply a scan signal and a data signal to the pixel electrode through the gate lines and the data lines. Connected with an external signal input terminal (not shown), the gate driving circuit part 32 and the data driving circuit part 31 control an external signal input through the external signal input terminal and output it to the pixel electrode. Although not shown in FIG. 3, a color filter for implementing color and a common electrode, which is a counter electrode to the pixel electrode, are formed in the image display region 135 of the color filter substrate 105. The array substrate 110 and the color filter substrate 105 are uniformly separated by a spacer (not shown) to have a cell gap. The array substrate 110 and the color filter substrate 105 are attached by a seal pattern (not shown) formed at an outer edge of the pixel part 135 to form a liquid crystal display panel.

As stated above, TFTs are formed adjacent to a crossing of a gate line and a data line in each unit pixel of the pixel part 135 of the array substrate 110 and in the driving circuit part 130 having a data driving circuit part 131 and the gate driving circuit part 132. In embodiments of the present invention, the amorphous silicon TFT is formed in the pixel part 135 and the polycrystalline silicon TFT is formed in the driving circuit part 130. In addition, in embodiments of the present invention, the amorphous silicon TFT and the polycrystalline silicon TFT can both be formed in the pixel part 135 and the polycrystalline silicon TFT can be formed in the driving circuit part 135.

The polycrystalline silicon TFT has a coplanar structure to improve crystallization efficiency and mobility characteristics and is formed using a fabrication process of the amorphous silicon TFT within a processing range in which the fabricating of the amorphous silicon TFT is not changed, whereby the amorphous silicon TFT and the polycrystalline silicon TFT can be simultaneously formed within one panel.

Figure 4:
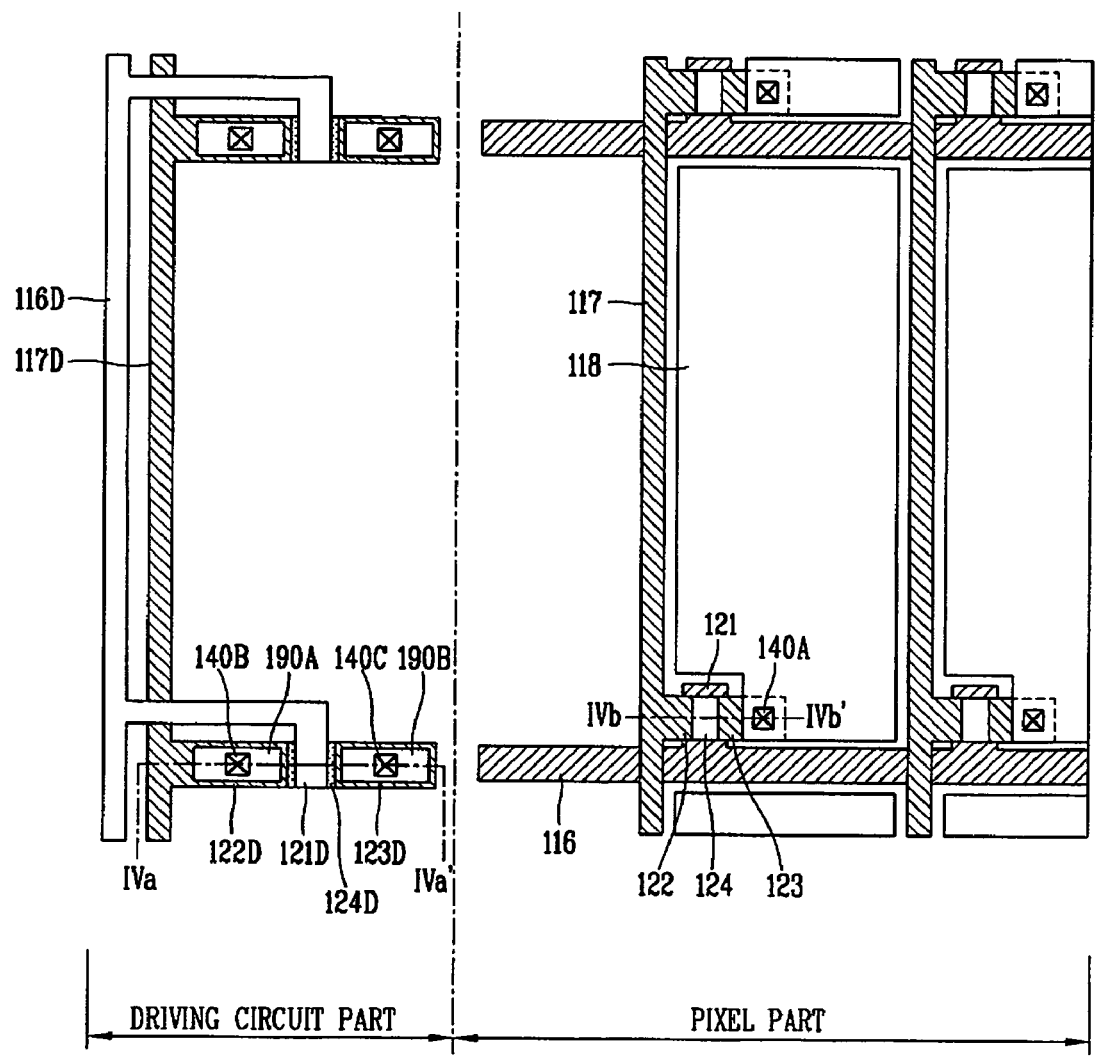
FIG. 4 is a plan view of a portion of an array substrate of an LCD device in accordance with an embodiment of the present invention.

FIG. 4 is a plan view of a portion of an array substrate of an LCD device in accordance with an embodiment of the present invention. The polycrystalline silicon TFT uses the polycrystalline silicon thin film as a channel layer and is formed in the driving circuit part and the amorphous silicon thin TFT using the amorphous silicon thin film as a channel layer is formed in the pixel part. However, embodiments of the present invention are not limited thereto because a combination of amorphous silicon TFTs and polycrystalline silicon TFTs can be implemented in the pixel part. The following description of the construction of the pixel part and the driving circuit part is for an embodiment of the present invention. But the present invention is not limited thereto and the pixel part and the driving circuit part can be constructed in various forms according to a circuit design as long as the amorphous silicon TFTs and the polycrystalline silicon TFTs are simultaneously implemented within one panel.

As shown in FIG. 4, a TFT of the driving circuit part includes a gate electrode 121D, a source electrode 122D, a drain electrode 123D and an active pattern 124D' formed on the array substrate of the driving circuit part. A first circuit line 116D and a second circuit line 117D are disposed to be electrically connected with the gate electrode 121D and the source and drain electrodes 122D and 123D of the TFT of the driving circuit part. The source electrode 122D connected with the second circuit line 117D is exposed through a first connection electrode 190A and the drain electrode 123D is exposed through the second connection electrode 190B so as to be electrically connected with a different circuit element. Reference numbers 140B and 140C in FIG. 4 denote second and third contact holes of the driving circuit part, respectively.

In the pixel part, a gate line 116 arranged horizontally and a data line 117 arranged vertically define a pixel region formed on the array substrate. Further, a TFT is formed adjacent to the crossing of the gate line 116 and the data line 117. A pixel electrode 118 is connected with the TFT of the pixel part, so that the pixel electrode together with the common electrode of the color filter substrate (not shown)

can drive liquid crystal (not shown) positioned between the array substrate and the color filter substrate (not shown).

A number N of gate lines and a number M of data lines cross to form N×M amount of pixels in the pixel part of the array substrate. Only one pixel region and a portion of an adjacent pixel region are shown in FIG. 4 for the sake of explanation. The TFT in the pixel part includes a gate electrode 121 connected to the gate line 116, a source electrode 122 connected to the data line 117 and a drain electrode 123 connected to the pixel electrode 118. In addition, the TFT of the pixel part also includes an insulation film (not shown) for insulating the gate electrode from both the source and drain electrodes 122 and 123. In addition, the TFT of the pixel part includes an active pattern 124 for forming a conductive channel between the source electrode 122 and the drain electrode 123 in response to a gate voltage applied to the gate electrode. A portion of the source electrode 122 is connected to the data line 117, and a portion of the drain electrode 123 is connected to the pixel electrode 118 through a first contact hole 140.

The TFT of the pixel part is constructed as an amorphous silicon TFT using the amorphous silicon thin film as an active pattern, while the TFT of the driving circuit part is constructed as the polycrystalline silicon TFT using the polycrystalline silicon thin film as the active pattern. In this case, as mentioned above, the pixel part can include both amorphous silicon TFTs and polycrystalline silicon TFTs. The amorphous silicon TFTs have a staggered structure while the polycrystalline silicon TFTs have a coplanar structure. In this embodiment of the present invention, the gate electrode of the polycrystalline silicon TFT, and the source and drain electrodes of the polycrystalline silicon TFT are formed on the same layer by using a conductive material that is also used to form the source and drain electrodes of the amorphous silicon thin film transistor, whereby the polycrystalline silicon TFT can be fabricated together in one panel within a process temperature range such that the fabrication process of the amorphous silicon TFT is not affected. By forming the polycrystalline silicon TFT with the coplanar structure in the driving circuit part, a high mobility device can be fabricated, and since a driver driving circuit can be installed directly on the panel, cost of a driver integrated circuit (IC) can be reduced.

At this time, the amorphous silicon thin film whose thickness is about 100 nm becomes thin after being over-etched when the source and drain electrodes are patterned. Thereafter, the amorphous silicon thin film is partially crystallized and used as a channel layer of the polycrystalline silicon TFT, so that the channel layers of the amorphous silicon TFT and the polycrystalline silicon TFT can be formed with the amorphous silicon thin film with the same thickness. In addition, in embodiments of the present invention, the active pattern and the source and drain electrodes of the amorphous silicon TFT and the polycrystalline silicon TFT can be formed through one time masking process to reduce the fabrication process and cost of the LCD device. The LCD device and its fabrication process will be described in detail with reference FIGS. 5A to 5G as follows.

Figure 5A:
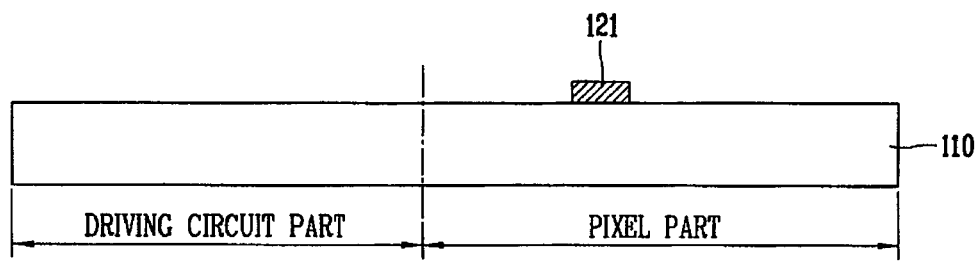
FIGS. 5A to 5G are cross-sectional views taken along lines IVa-IVa' and IVb-IVb' sequentially showing a process of fabricating an array substrate in accordance with an embodiment of the present invention.

FIGS. 5A to 5G are cross-sectional views taken along lines IVa-IVa' and IVb-IVb' sequentially showing a process of fabricating an array substrate in accordance with an embodiment of the present invention. The left side of FIGS. 5A to 5G shows a fabrication process of the array substrate of the driving circuit part and the right side of of FIGS. 5A to 5G shows a fabrication process of the array substrate of the pixel part. As shown in FIG. 5A, the gate electrode 121 is formed in the pixel part by using a photolithography process (a first masking process) on the substrate 110 made of a transparent insulation material, such as glass. The gate electrode 121 can be formed of a low resistance conductive material, such as aluminum (Al), an aluminum alloy, tungsten (W), copper (Cu), chromium (Cr), molybdenum (Mo) or the like.

Figure 5B:
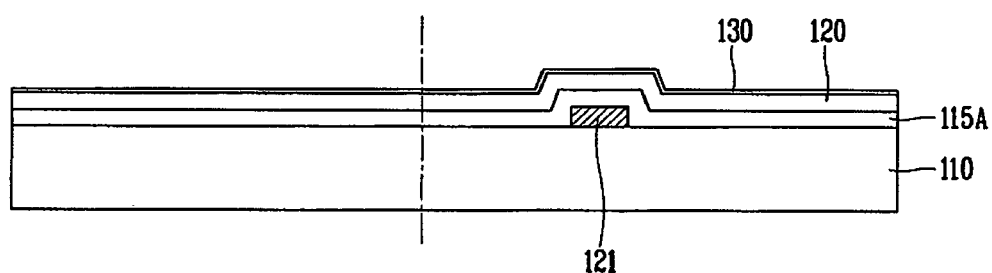

Thereafter, as shown in FIG. 5B, a first insulation film 115A, an amorphous silicon thin film 120 and an n+ amorphous silicon thin film 130 are sequentially formed across the surface of the substrate 110. The first insulation film 115A serves as a gate insulation film in the TFT of the pixel part and as a buffer layer for a crystallization process (to be described later) in the driving circuit part. The amorphous silicon thin film 120 is used as a channel layer in the amorphous silicon TFT of the pixel part and the polycrystalline silicon TFT of the driving circuit part. Since the amorphous silicon TFT is formed as a back channel etch type, the amorphous silicon the film 120 has a thickness of about 100~200 nm.

Figure 5C:
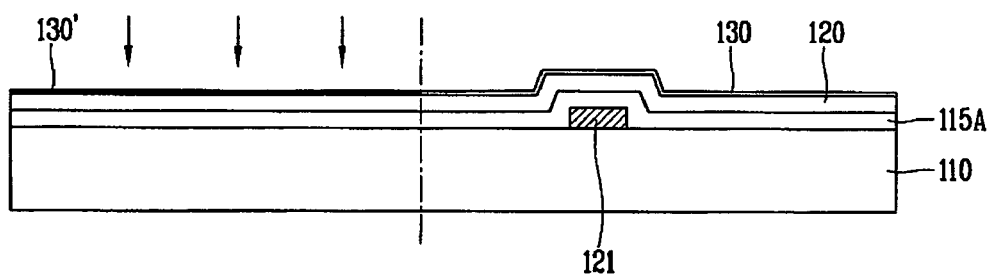

Then, as shown in FIG. 5C, the dopant of an n+ amorphous silicon thin film 130' in the driving circuit part is activated through a selective activation process so that the n+ amorphous silicon thin film 130' can be used as an ohmic-contact layer in the polycrystalline silicon TFT. For example, the selective activation process is performed through laser irradiation using a shadow mask. When the polycrystalline silicon TFT is to be formed in the pixel part, the selective laser irradiation is made in a certain region of the pixel part where the polycrystalline silicon TFT is to be formed.

Figure 5D:
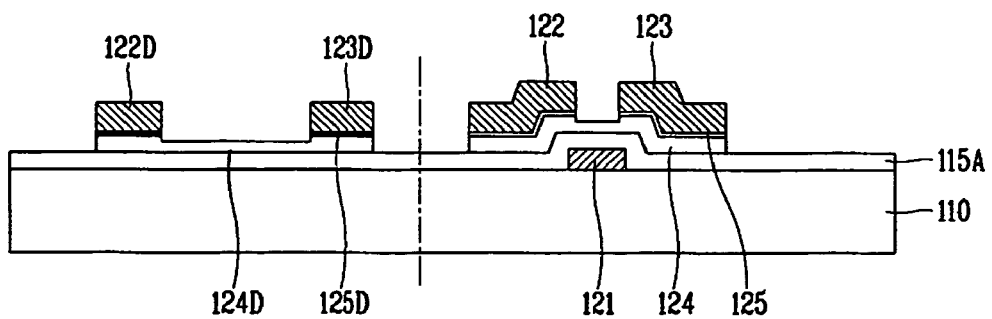

Next, as shown in FIG. 5D, a conductive material for source and drain electrodes is deposited across the surface of the substrate 110 and then patterned by using a photolithography process (a second masking process) to form active patterns 124 and 124D, and source and drain electrodes 122, 122D, 123 and 123D in the pixel part and in the driving part. At this time, the n+ amorphous silicon thin films 130 and 130' are also patterned to form ohmic-contact layers 125 and 125D connecting the active patterns 124 and 124D and the source and drain electrodes 122, 122D, 123 and 123D. The active patterns 124 and 124D and the source and drain electrodes 122, 122D, 123 and 123D of the pixel part and the driving circuit part can be formed through a single masking process by using slit exposure, which will now be described with reference to FIGS. 6A to 6F.

Figure 5E:
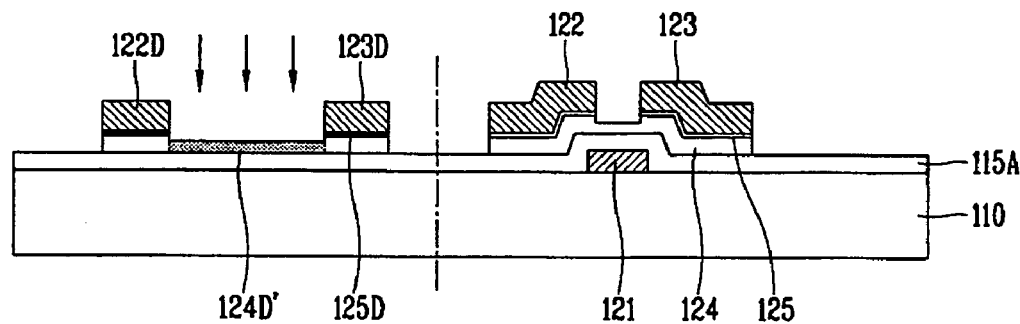

Thereafter, as shown in FIG. 5E, a laser is selectively irradiated onto a certain region of the active pattern 124D of the driving circuit part. More specifically, the channel region between the source and drain electrodes 122D and 123D of the driving circuit part is irradiated to crystallize the channel region such that the active pattern 124D' of the driving circuit part becomes a polycrystalline silicon thin film. To crystallize the amorphous silicon thin film, various types of crystallization methods can be used. In the case of employing a laser annealing method, an eximer laser annealing (ELA) method using a pulse type laser is typically used.

In the alternative, a sequential lateral solidification (SLS) method can be used in which grains are grown to remarkably improve crystallization characteristics can be also used. The SLS uses the phenomena that grains grow in a vertical direction to an interface between liquid phase silicon and solid phase silicon. By growing grains to a certain length laterally through suitably controlling the size of a laser beam and the power of the laser beam, the size of silicon grains can be enhanced.

Although it is shown that the amorphous silicon TFT formed of the amorphous silicon thin film is formed in the pixel part as an example, as mentioned above, the amorphous silicon TFT and the polycrystalline silicon TFT formed by selective crystallization can both be formed in the pixel part. In addition, although the active pattern 124D' including the polycrystalline silicon TFT formed by selectively crystallizing only the central channel region is shown as the example, embodiments of the present invention are not limited thereto and when the lateral crystallization, such as the SLS method is used, the entire region including the central channel region can be crystallized into the polycrystalline silicon thin film.

Figure 5F:
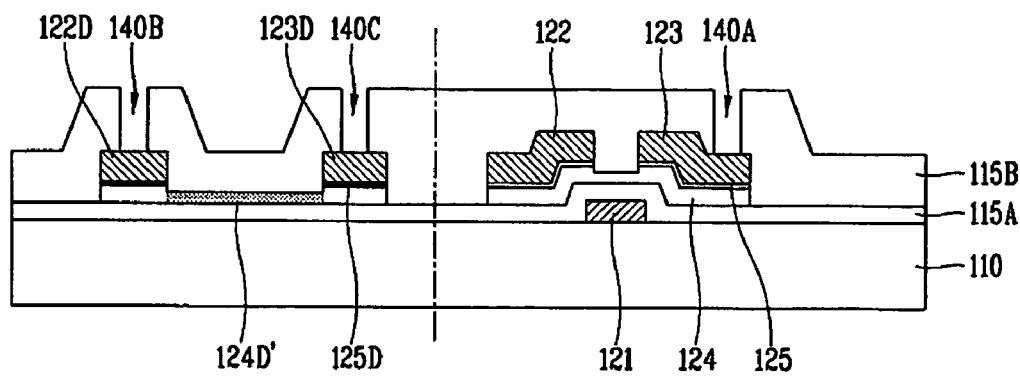

Next, as shown in FIG. 5F, a second insulation film 115B is formed across a surface of the substrate 110 and then selectively patterned by using the photolithography process (a third masking process) to form a first contact hole 140A exposing a portion of the drain electrode 123 of the pixel part, a second contact hole 140B exposing a portion of the source electrode 122D and a third contact hole 140C exposing a portion of the drain electrode 123D of the driving circuit part. The second insulation film 115B is used as a gate insulation film for the polycrystalline silicon TFT. The second insulation film 115B can be formed as a silicon oxide film having desired interface characteristics with the polycrystalline silicon thin film of the driving circuit part active pattern 124D'.

Figure 5G:
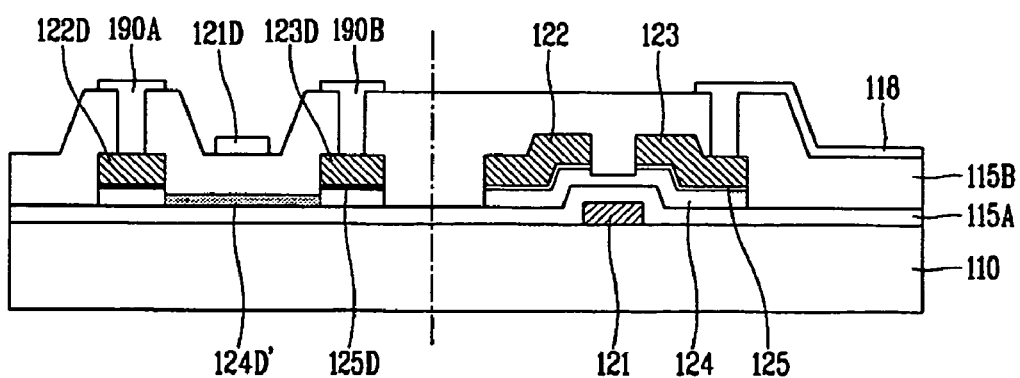

Then, as shown in FIG. 5G, a transparent conductive material is deposited on the surface of the substrate and patterned by using the photolithography process (a fourth masking process) to form the pixel electrode 118 electrically connected to the drain electrode 123 through the first contact hole 140A in the pixel part, a first connection electrode 190A connected to the source electrode 122D through the second contact hole 140B in the driving circuit part, and a second connection electrode 190B connected to the drain electrode 123D of the driving circuit unit. In addition, a gate electrode 121 of the polycrystalline silicon TFT is formed of a transparent conductive material at an upper portion of the active pattern 124D' of the driving circuit part by using the fourth masking process. The transparent conductive material of the pixel electrode 118 of the pixel part and the connection electrodes 190A and 190B and the gate electrode 121D of the driving circuit part, and the gate electrode can be indium tin oxide (ITO) or indium zinc oxide (IZO) having desired light transmittance.

Figure 6A:
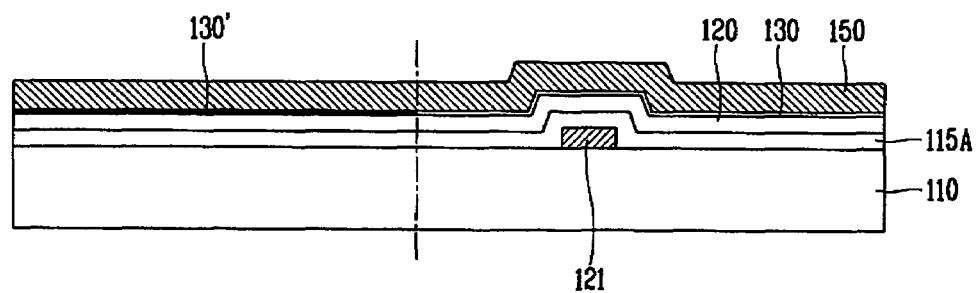
FIGS. 6A to 6F are cross-sectional views showing a second masking process for forming an active pattern and source and drain electrodes by using a slit (diffraction) exposure in FIG. 5D.
Figure 6B:
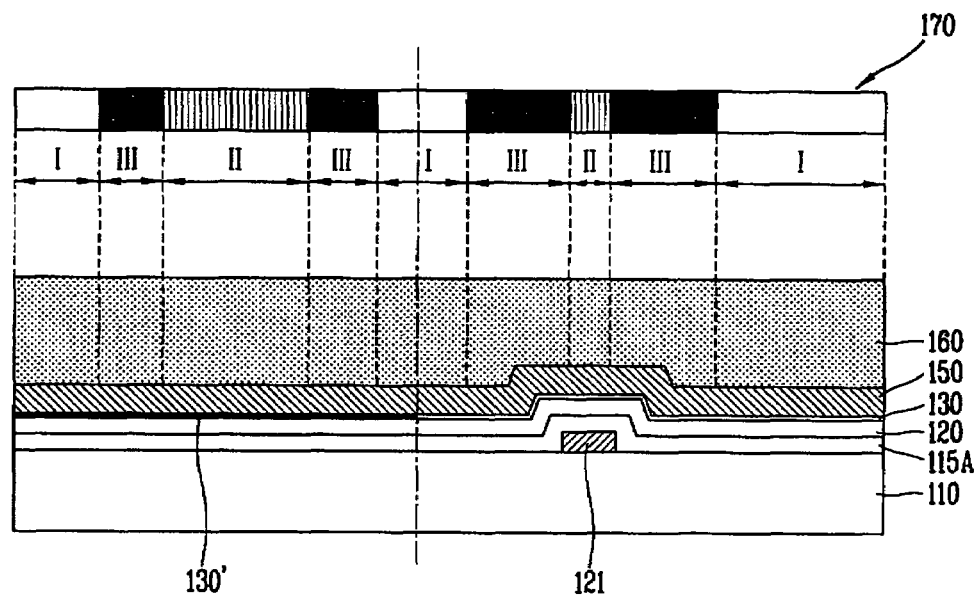

FIGS. 6A to 6F are cross-sectional views showing a second masking process for forming an active pattern and source and drain electrodes by using a slit (diffraction) exposure in FIG. 5D. As shown in FIG. 6A, a conductive film 150 of a low resistance conductive material is formed across the surface of the substrate 110 on which the first insulation film 115A, the amorphous silicon thin film 120 and the n+ amorphous silicon thin film 130 have been sequentially formed. Thereafter, as shown in FIG. 6B, a photosensitive film 160 of a photosensitive material, such as photoresist, is formed across the surface of the substrate 110 and light is irradiated on the photosensitive film 160 through slit mask 170 having a slit region.

The slit mask 170 includes a first transmission region (I) for transmitting the entire light, a second transmission region (II) for transmitting a portion of light, and a blocking region III for blocking the entire irradiated light. Only light which has transmitted through the mask 170 can be irradiated on the photosensitive film 160. In the slit mask 170 used in this embodiment of the present invention, the second transmission region (II) has a slit structure. The amount of exposed light irradiated through the second transmission region (II) is smaller than the amount of exposed light irradiated through the first transmission regions (I). Thus, after the photosensitive film 160 is coated, when the photosensitive film 160 is exposed and developed by using the mask 170 having the partial slit region (II), the thickness of the photosensitive film remaining on the slit region (II) is different from the thickness of the photosensitive film remaining on the first transmission regions (I) and on the blocking regions (III).

In the case of using positive type photoresist as the photosensitive film 160, the thickness of photosensitive film remaining on the slit region (II) is thinner than the thickness of the photosensitive film remaining on the block regions (III), and in case of using negative type photoresist as the photosensitive film 170, the thickness of the photosensitive film remaining on the slit region (II) is thinner than that of the photosensitive film remaining on the first transmission regions (I). In this embodiment, the positive type photoresist is used, but the present invention is not limited thereto and a negative type photoresist can be also used.

Figure 6C:
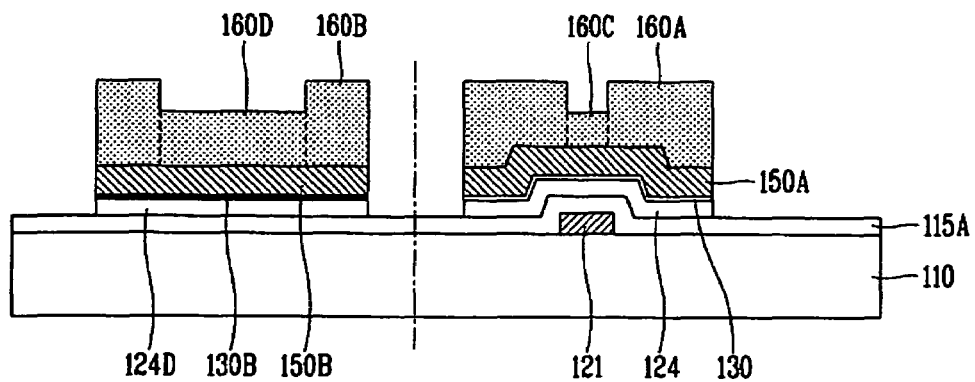

Subsequently, when the photosensitive film 160 is developed through the slit (diffraction) mask 170, as shown in FIG. 6C, photosensitive film patterns 160A and 160D each with a certain thickness remain on the region where light is entirely and partially blocked through the blocking regions (III) and the second transmission region (II), respectively, while the photosensitive film at the first transmission region (I) on which light was entirely irradiated is removed to expose the surface of the conductive film 150.

At this time, the first and second photosensitive film patterns 160A and 160B formed through the blocking region (III) are thicker than the third and fourth photosensitive film patterns 160C and 160D formed at the second transmission region (III). Namely, the first and second photosensitive film patterns 160A and 160B with a first thickness remain at the upper portion of the source and drain electrodes while the third and fourth photosensitive film patterns 160C and 160D with a second thickness remain between the source and drain electrode regions of the pixel part and the driving circuit part.

Figure 6D:
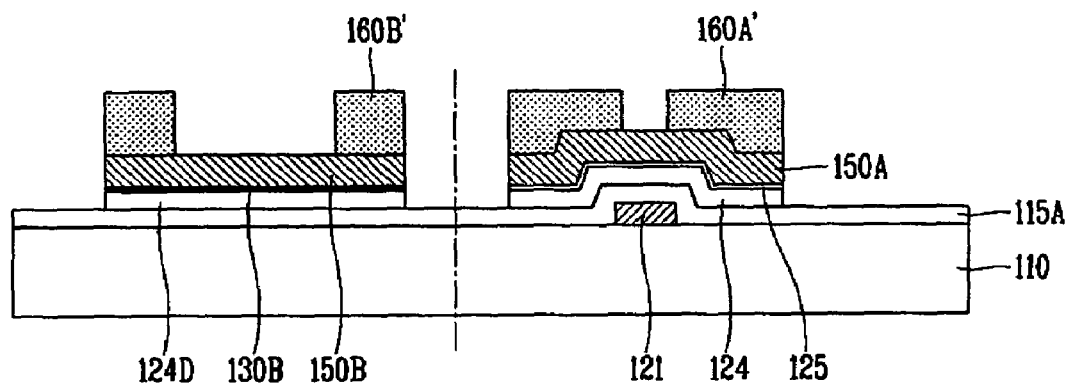

Thereafter, the lower conductive film 150, the n+ amorphous silicon thin film 130 and the amorphous silicon thin film 120 are selectively removed by using the photosensitive film patterns 160A~160D as masks, to form the active patterns 124 and 124D formed of the amorphous silicon thin film in the pixel part and in the driving circuit part. At this time, n+ amorphous silicon thin film patterns 130A and 130B and conductive film patterns 150A and 150B which have been patterned in the form of the active patterns 124 and 124D are formed at an upper portion of the active patterns 124 and 124D of the pixel part and of the driving circuit part. And then, when an ashing process is performed to completely remove the third and fourth photosensitive film patterns 160C and 160D formed at the second transmission region (II), as shown in FIG. 6D, the first photosensitive film pattern 160A of the pixel part and the second photosensitive film pattern 160B of the driving circuit part remain as fifth and sixth photosensitive film patterns 160A' and 160B' with a third thickness and the third and fourth photosensitive film patterns 160C and 160D of the second transmission region (II) have been removed.

Figure 6E:
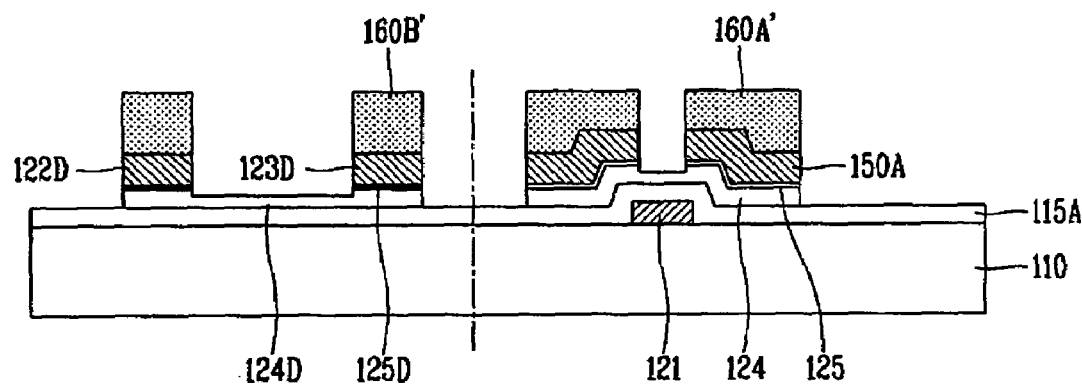

Thereafter, when the lower conductive film patterns 150A and 150B and the n+ amorphous silicon thin film patterns 130A and 130B are selectively removed by using the remaining photosensitive film patterns 160A' and 160B' as masks, as shown in FIG. 6E, the source and drain electrodes 122, 122D, 123 and 123D are formed at an upper portion of the active patterns 124 and 124D. The n+ amorphous silicon thin film patterns 130A and 130 are also patterned to have the same shape to form the ohmic-contact layers 125 and 125D connecting the source and drain electrodes 122, 122D, 123 and 123D and the active patterns 124 and 124D.

Because the amorphous silicon TFT is formed as an back-channel etch type, when the n+ amorphous silicon thin film patterns 130A and 130B are etched, a portion of the surface of the amorphous silicon thin film constituting the lower pixel part active pattern 124 is removed. The final thickness of the remaining amorphous silicon thin film after being over-etched is about 30~100 nm, which is suitable for the crystallization process of the silicon thin film (to be described).

Figure 6F:
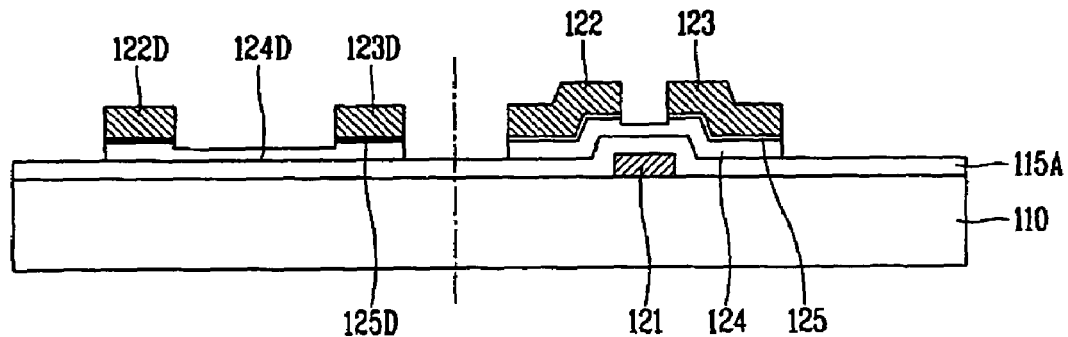

Thereafter, as shown in FIG. 6F, the remaining photosensitive film patterns 160A' and 160B' are removed. In this manner, the active layer 120' and the ohmic contact layers 130A and 130B can be formed through one time of masking process by using the slit exposure, so one mask can be omitted and thus the number of masks is reduced. However, the present invention is not limited thereto and the active layer 120' and the ohmic contact layers 130A and 130B can be formed through a separate masking process, namely, through two masking processes.

By forming the active patterns 124 and 124D and the source and drain electrodes 122, 122D, 123 and 12D of the pixel part and the driving circuit part through one masking process using slit exposure, the number of masking processes can be reduced. However, the present invention is not limited thereto and the active patterns 124 and 124D and the source and drain electrodes 122, 122D, 123 and 12D of the pixel part and the driving circuit part can be formed through a separate masking process, namely, through two masking processes.

As so far described, the driving circuit-integrated LCD device in accordance with the present invention has many advantages. That is, for example, by simultaneously forming the polycrystalline silicon TFT in the driving circuit unit within a range that the fabrication process of the amorphous silicon TFT is not affected, the driver driving circuit can be installed in the panel without performing an additional fabrication process. In addition, unlike typical driving circuit-integrated LCD devices, the pixel part can include the amorphous silicon TFT using the amorphous silicon thin film, so laser irradiation is required only at a portion where the crystallization process is required, and thus, the productivity can be enhanced compared with the laser crystallization made on the entire surface of the substrate. Moreover, by forming the active pattern and the source and drain electrodes through a one time masking process using slit exposure, the amorphous silicon TFT and the polycrystalline silicon TFT can be simultaneously formed in the single panel using only four masking processes.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device comprising:
   a first substrate divided into a pixel part and a driving circuit part;
   an amorphous silicon thin film transistor formed on the pixel part of the first substrate having a gate electrode, an active pattern, source and drain electrodes and a pixel electrode;
   a polycrystalline silicon thin film transistor formed in the driving circuit part of the first substrate and having an active pattern, source and drain electrodes and a gate electrode formed on the same layers respectively corresponding to the active pattern, the source and drain electrodes and the pixel electrode of the amorphous silicon thin film transistor; and
   a second substrate, a color filter substrate, attached to the first substrate in a facing manner.

2. The device of claim 1, wherein the source and drain electrodes of the driving circuit part are made of a first conductive material, which is substantially the same as that of the source and drain electrodes of the pixel part.

3. The device of claim 2, wherein the first conductive material is one of aluminum, an aluminum alloy, tungsten, copper, chromium and molybdenum.

4. The device of claim 1, wherein the gate electrode of the driving circuit part is made of a second conductive material which is substantially the same as that of the pixel electrode of the pixel part.

5. The device of claim 4, wherein the second conductive material is one of indium-tin-oxide and indium-zinc-oxide.

6. The device of claim 1, further comprising:
   a first insulation film formed between the gate electrode and the active pattern of the pixel part and used as a gate insulation film of the thin film transistor in the pixel part.

7. The device of claim 6, further comprising:
   the first insulation film as a buffer layer formed at a lower portion of the active pattern of the driving circuit part.

8. The device of claim 1, further comprising:
   an ohmic-contact layer formed of an n+ amorphous silicon thin film and connecting regions of the active patterns to source and drain electrodes of the pixel part and the driving circuit part.

9. The device of claim 8, wherein the n+ amorphous silicon thin film transistor of the driving circuit part is activated through a selective laser irradiation.

10. The device of claim 1, further comprising:
    a second insulation film formed between the source and drain electrodes and the pixel electrode of the pixel part.

11. The device of claim 9, further comprising:
    a driving circuit part gate insulation film formed between the active pattern and the gate electrode of the driving circuit part using the second insulation film.

12. The device of claim 4, further comprising:
    a first connection electrode connected with the source electrode of the driving circuit part; and
    a second connection electrode exposed by being connected with the drain electrode of the driving circuit part,
    the first and second connection electrodes being formed on the same layer on which the pixel electrode is formed.

13. The device of claim 1, wherein the active pattern of the pixel part is formed of the amorphous silicon thin film and the active pattern of the driving circuit part is formed of the polycrystalline silicon thin film obtained by crystallizing the amorphous silicon thin film.

14. A liquid crystal display device comprising:
    an amorphous silicon thin film transistor formed on a first region of a first substrate and comprised of a gate electrode, an active pattern, source and drain electrodes and a pixel electrode;

a polycrystalline silicon thin film transistor formed on a second region of the first substrate and comprised of an active pattern, source and drain electrodes and a gate electrode formed on the same layer respectively corresponding to the active pattern, the source and drain electrodes and the pixel electrode of the first region; and a second substrate, a color filter substrate, attached to the first substrate in a facing manner.

15. The device of claim 14, wherein the first region is a pixel part and the second region is a driving circuit part.

16. The device of claim 14, wherein the first region is a third region of the pixel part and the second region is a remaining fourth region of the pixel part and the driving circuit part.

* * * * *